(12) United States Patent
Miura

(10) Patent No.: US 11,237,467 B2
(45) Date of Patent: Feb. 1, 2022

(54) LIGHT SYNTHESIZING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 160 days.

(21) Appl. No.: 16/655,652

(22) Filed: Oct. 17, 2019

(65) Prior Publication Data

US 2020/0124953 A1 Apr. 23, 2020

(30) Foreign Application Priority Data

Oct. 23, 2018 (JP) .............................. JP2018-199186

(51) Int. Cl.
```
G03B 21/20      (2006.01)
H01S 5/40       (2006.01)
G02B 5/30       (2006.01)
G02B 27/28      (2006.01)
H01S 5/02208    (2021.01)
H01S 5/02253    (2021.01)
```
(Continued)

(52) U.S. Cl.
CPC ....... *G03B 21/2033* (2013.01); *G02B 5/3083* (2013.01); *G02B 27/283* (2013.01); *G03B 21/2013* (2013.01); *G03B 21/2073* (2013.01); *H01S 5/02208* (2013.01); *H01S 5/02253* (2021.01); *H01S 5/02255* (2021.01); *H01S 5/4012* (2013.01); *H01S 5/4093* (2013.01); *G03B 21/008* (2013.01)

(58) Field of Classification Search
None
See application file for complete search history.

(56) References Cited

U.S. PATENT DOCUMENTS 9,209,605 B1 * 12/2015 Guo ...................... H01S 5/4062
2010/0053559 A1 3/2010 Ushigome et al.
(Continued)

FOREIGN PATENT DOCUMENTS

| JP | 2006-133601 A | 5/2006 |
|----|---------------|--------|
| JP | 2010-054572 A | 3/2010 |

(Continued)

*Primary Examiner* — Michelle M Iacoletti
*Assistant Examiner* — Danell L Owens
(74) *Attorney, Agent, or Firm* — Global IP Counselors, LLP

(57) ABSTRACT

A light synthesizing device includes first and second light emitting devices, first and second polarization control members, and a synthesis member. Each of the first and second light emitting devices has at least one first semiconductor laser element and at least one second semiconductor laser element, and configured such that a polarization direction of exit light from the first semiconductor laser element is different from a polarization direction of exit light from the second semiconductor laser element. The first and second polarization control members are respectively configured to change the polarization directions of the exit lights from the first semiconductor laser element of the first light emitting device and the second semiconductor laser element of the second light emitting device. The synthesis member is configured to combine light exited from the first light emitting device and light exited from the second light emitting device.

19 Claims, 7 Drawing Sheets

(51) Int. Cl.
*H01S 5/02255* (2021.01)
*H01S 5/022* (2021.01)
*G03B 21/00* (2006.01)

(56) References Cited

U.S. PATENT DOCUMENTS

2012/0061356 A1* 3/2012 Fukumitsu ............ B28D 5/0005
 219/121.61
2014/0092364 A1* 4/2014 Janssens ................ F21V 13/00
 353/8

FOREIGN PATENT DOCUMENTS

| JP | 2016-186566 A | 10/2016 |
| JP | 2017-015993 A | 1/2017 |
| JP | 2017-142904 A | 8/2017 |

* cited by examiner

LIGHT SYNTHESIZING DEVICE

CROSS-REFERENCE TO RELATED APPLICATION

This application claims priority to Japanese Patent Application No. 2018-199186 filed on Oct. 23, 2018, the disclosure of which is hereby incorporated herein by reference in its entirety.

TECHNICAL FIELD

The present disclosure relates to a light synthesizing device and a light emitting device for being mounted in the light synthesizing device.

BACKGROUND ART

Conventional techniques for combining the light emitted from a plurality of light emitting elements are known. For example, Japanese published unexamined application No. 2016-186566 discloses a light source unit in which light from two semiconductor lasers with different polarization states is incident on a polarizing beam splitter (PBS) and combined.

SUMMARY

However, the above patent literature discloses that one light source unit has two semiconductor lasers with different polarization states, and combines the light emitted from this light source unit, but the combination of the light emitted from a plurality of light source units is not disclosed.

The present disclosure includes the following aspects.

A light synthesizing device includes a first light emitting device and a second light emitting device, a first polarization control member, a second polarization control member, and a synthesis member. The first light emitting device and a second light emitting device each have at least one first semiconductor laser element and at least one second semiconductor laser element. Each of the first light emitting device and the second light emitting device is configured such that a polarization direction of exit light from the at least one first semiconductor laser element that has exited a corresponding one of the first light emitting device and the second light emitting device is different from a polarization direction of exit light from the at least one second semiconductor laser element that has exited the corresponding one of the first light emitting device and the second light emitting device. The first polarization control member is configured to change the polarization direction of the exit light from the first semiconductor laser element of the first light emitting device. The second polarization control member is configured to change the polarization direction of the exit light from the second semiconductor laser element of the second light emitting device. The synthesis member is configured to combine light exited from the first light emitting device including the exit light from the at least one first semiconductor laser element of the first light emitting device whose polarization direction has been changed by the first polarization control member, and light exited from the second light emitting device including the exit light from the at least one second semiconductor laser element of the second light emitting device whose polarization direction has been changed by the second polarization control member.

Further, a light emitting device to be used among a plurality of light emitting devices mounted in the light synthesizing device of the above includes at least one first semiconductor laser element and at least two second semiconductor laser elements, the first semiconductor laser element emits red light, one of the two second semiconductor laser elements emits blue light, and the other one emits green light, and a polarization direction of the exit light from which the light emitted by the first semiconductor laser element has exited the light emitting device is different from a polarization direction of the exit light from which the light emitted by the second semiconductor laser element has exited the light emitting device.

With the light synthesizing device of the present disclosure, light can be effectively combined using a plurality of light emitting devices.

Also, the light emitting device according to the present disclosure can be used to advantage in a light synthesizing device used as a projection device according to the present invention, and can provide a projection device capable of effectively combining light using a plurality of light emitting devices.

DETAILED DESCRIPTION

Figure 1:
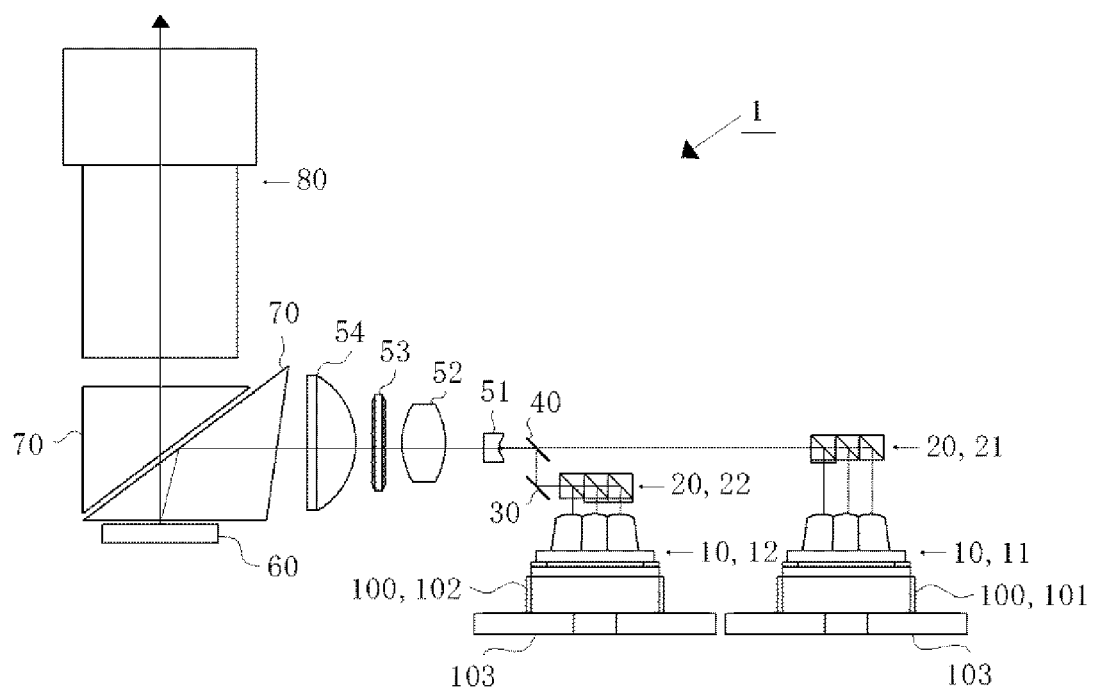
FIG. 1 is a schematic view showing an optical configuration of a projection apparatus according to an embodiment of the present disclosure.

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

In an embodiment, the details of the invention will be described by describing a projection device 1 which is an example of a light synthesizing device. The light synthesizing device has a plurality of light emitting devices 100, a first polarization control member 21, a second polarization control member 22, and a synthesis member. Each of the plurality of light emitting devices 100 has one or more first semiconductor laser elements 121 and one or more second semiconductor laser elements 122.

FIG. 1 is shows the optical configuration of the projection device 1 according to an embodiment. An arrow is added auxiliary to explain the travel direction of the light. The projection device 1 is a device that projects an image such as a moving picture or a still picture on a screen. A projector is an example of the projection device 1.

The projection device 1 has two light emitting units 10, two polarization control members 20, a mirror 30, a polarizing beam splitter (hereinafter referred to as PBS) 40, four lenses 51-54, a digital micromirror device (hereinafter referred to as DMD) 60, two prisms 70, and a projection unit 80. The number of the light emitting units 10 and the polarization control members 20 is not limited, so long as there are two or more of each. The number of the lenses is not limited to four. The number of the prisms 70 is not limited to two.

The light emitting units 10 each have a light emitting device 100 and a mounting substrate 103. The two polarization control members 20 are the first polarization control member 21 and the second polarization control member 22. The four lenses are a diffusion lens 51, a collimator lens 52, a lens array 53, and a superimposing lens 54.

In this Specification, in the case that the two light emitting units 10 are distinguished, they will be referred to as a first light emitting unit 11 and a second light emitting unit 12. In the case that the light emitting device 100 included in the first light emitting unit 11 is to be distinguished from the light emitting device 100 included in the second light emitting unit 12, they will be referred to as a first light emitting device 101 and a second light emitting device 102, respectively.

In addition, each light emitting device 100 has a plurality of semiconductor laser elements 120. These semiconductor laser elements 120 emit linearly polarized light. The plurality of semiconductor laser elements 120 include one or more first semiconductor laser elements 121 and one or more second semiconductor laser elements 122.

The light emitting device 100 is configured so that the light emitted from the first semiconductor laser element 121 and the light emitted from the second semiconductor laser element 122 have different polarization directions when the lights are emitted from the light emitting device 100. Also, the light emitted from the first semiconductor laser element 121 and the light emitted from the second semiconductor laser element 122 both exit the light emitting devices 100 in the same direction. Here, the light emitted from the semiconductor laser element 120 before it is emitted to the outside of the light emitting device 100 is referred to as emitted light, and the light that is emitted from the semiconductor laser element 120 and has exited to the outside of the light emitting device 100 is referred to as exit light, so as to distinguish between the two.

That is, the exit light from the first semiconductor laser element 121 and the exit light from the second semiconductor laser element 122, which exit so as to proceed in the same direction from the light emitting device 100, have different polarization directions.

For example, the semiconductor laser elements 120 can be configured such that the emitted light from the light exit end face of the first semiconductor laser element 121 and the emitted light from the light exit end face of the second semiconductor laser element 122 have different polarization directions. As these semiconductor laser elements 120, for example, the first semiconductor laser element 121 can be a semiconductor laser element whose polarization is TM (transverse-magnetic) mode (TM polarization), and the second semiconductor laser element 122 can be a semiconductor laser element whose polarization is TE (transverse-electric) mode (TE polarization). Details of an example of the light emitting device 100 applied to the projection device 1 will be described below.

Here, in a plane parallel to the light exit end face of the semiconductor laser element 120, the light emitted from the semiconductor laser element 120 has an elliptical far-field pattern (FFP) in which the length in the lamination direction of the plurality of semiconductor layers including the active layer is greater than the length in the direction perpendicular to the lamination direction. The FFP is the shape or light intensity distribution of the emitted light at a position sufficiently far away from the light exit end face of the semiconductor laser element 120.

In this Specification, light having an optical intensity of at least $1/e^2$ of the peak intensity value shall refer to as the main portion of light of the semiconductor laser element 120. Also, the term FFP shall refer to the shape of the FFP produced by light with an optical intensity of $1/e^2$ of the peak intensity value. Also, light traveling through the center of an ellipse representing FFP shall be called central light. Also, a straight line passing through the center of the FFP ellipse and the emission position of the central light at the light exit end face shall refer to the optical axis. That is, in this Specification, the central light is light passing along the optical axis from the light exit end face.

In the light emitting device 100, at least the central light beams of each of the first semiconductor laser element 121 and the second semiconductor laser element 122 exit in the same direction. Here, "the same direction" shall encompass a difference of five degrees. Alternatively, the light emitting device 100 may be designed so that the light beams travel in the same direction, and the range of error that occurs during manufacture is encompassed.

One or more of the first semiconductor laser elements 121 and one or more of the second semiconductor laser elements 122 can be provided in one light emitting device 100. In addition, there may be another semiconductor laser element 120 in which the polarization direction of central light exited from the light emitting device 100 is different from that of both the first semiconductor laser element 121 and the second semiconductor laser element 122.

In the example shown in FIG. 1, the light emitted from the three semiconductor laser elements 120 exits a single light emitting device 100. Each beam of exit light exits as collimated light. Here, of the three semiconductor laser elements 120, one is the first semiconductor laser element 121, and two are the second semiconductor laser elements 122.

Regarding the exit light that exits the first light emitting device 101 and the exit light that exits the second light emitting device 102, the exit light beams from the first semiconductor laser elements 121 exit in the same travel direction (exit direction) and the same polarization direction. Similarly, the exit light beams from the second semiconductor laser elements 122 exit in the same travel direction (exit direction) and the same polarization direction. Here, the same polarization direction means a relationship in which the relative angle difference of the polarization directions of the exit light beams from the semiconductor laser elements 120 is within 10 degrees.

In the example shown in FIG. 1, the two light emitting units 10 are disposed side by side and facing in the same direction. The two light emitting units 10 are disposed such that the travel directions of the central lights, the polarization directions of the first semiconductor laser elements 121, and the polarization directions of the second semiconductor laser elements 122 are the same between the light emitting units 10.

Figure 2:
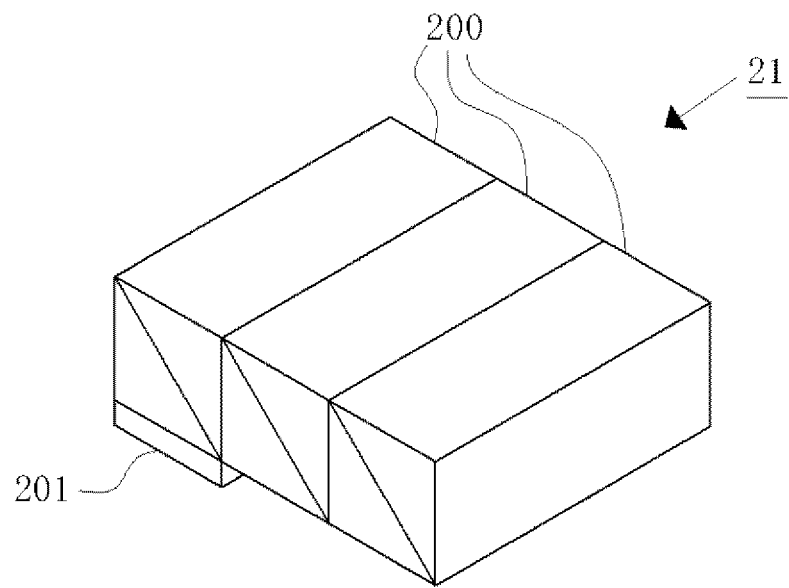
FIG. 2 is a perspective view of a first polarization control member according to an embodiment of the present disclosure.
Figure 3:
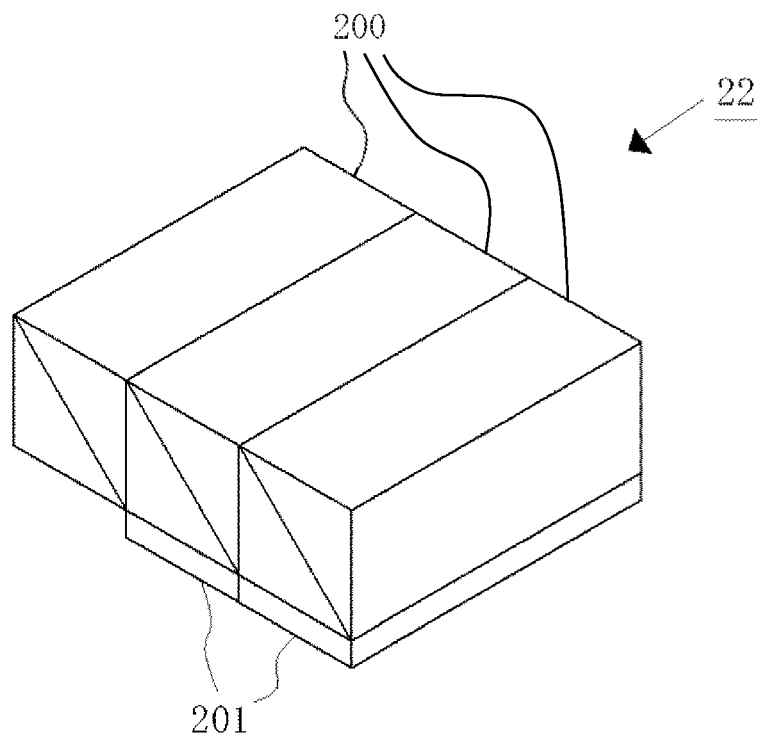
FIG. 3 is a perspective view of a second polarization control member according to an embodiment of the present disclosure.

The polarization control member 20 has a dichroic mirror 200 and a waveplate 201. FIGS. 2 and 3 are simplified perspective views of the first polarization control member 21 and the second polarization control member 22, respectively. The first polarization control member 21 is a member that controls the polarization direction of the exit light from the first light emitting device 101 of the first light emitting unit 11. The second polarization control member 22 is a member that controls the polarization direction of the exit light from the second light emitting device 102 of the second light emitting unit 12.

Three dichroic mirrors 200 are disposed side by side in each of the first polarization control member 21 and the second polarization control member 22. The three dichroic mirrors 200 respectively correspond to the three semiconductor laser elements 120 disposed in the light emitting device 100. That is, each of the dichroic mirrors 200 reflects light having the wavelength of the light emitted by the corresponding semiconductor laser element 120, but transmits light of other wavelengths.

The number of dichroic mirrors 200 is not limited to three, as long as there are two or more. Also, the number of semiconductor laser elements 120 disposed in a light emitting device 100 need not be the same as the number of the dichroic mirrors 200. Also, as to a dichroic mirror 200 that needs to only reflect the exit light from the corresponding semiconductor laser element 120 and does not need to transmit the exit light from the other semiconductor laser elements 120, a mirror that merely reflects light may be used instead of the dichroic mirror 200.

The exit light beams from the three semiconductor laser elements 120 are combined (also, referred to as mixed or synthesized) by the three dichroic mirrors 200. That is, because the three dichroic mirrors 200 are interposed, the exit light beams from the three semiconductor laser elements 120 travel in the same direction. The phrase "same direction" means that the relative angle difference in the travel direction of the central light is within five degrees between any two of the three semiconductor laser elements 120.

Figure 4:
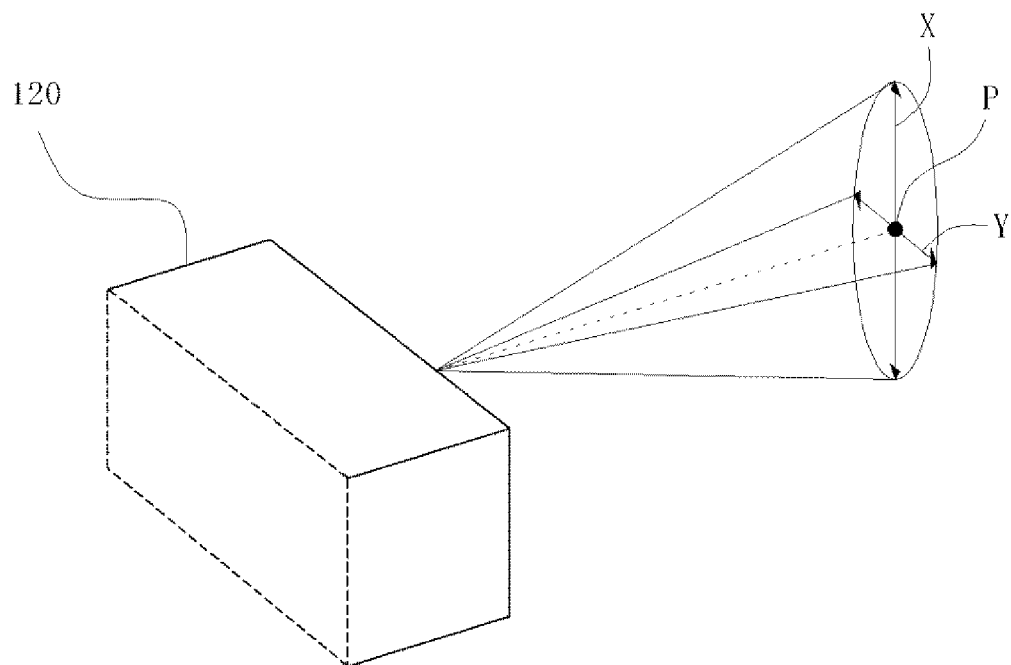
FIG. 4 is a schematic view showing a center, a first diameter and a second diameter pertaining to light emitted from a single-emitter semiconductor laser element.
Figure 5:
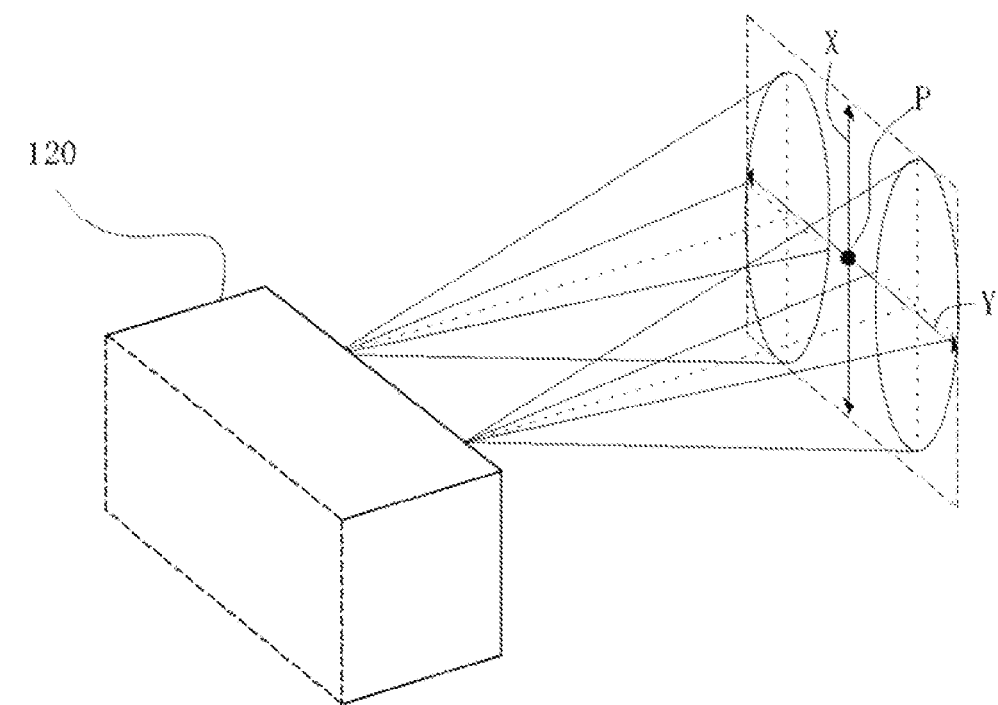
FIG. 5 is a schematic view showing a center, a first diameter, and a second diameter pertaining to light emitted from a multi-emitter semiconductor laser element.

Here, the center, the first diameter, and the second diameter of light emitted from each semiconductor laser element 120 will be defined with reference to FIGS. 4 and 5. FIG. 4 shows the case of a single-emitter semiconductor laser element 120 with one emitter (light emitting point), and FIG. 5 shows the case of a multi-emitter semiconductor laser element 120 with two emitters. In these drawings, the elliptical shapes represent the FFP. Also, the point P indicates the center, the line segment X indicates the first diameter, and the line segment Y indicates the second diameter. The portion of the semiconductor laser element 120 near the exit point is partially shown.

As shown in FIG. 4, in the single-emitter semiconductor laser element 120, one elliptical shape corresponding to one emitter is shown. On the other hand, in the multi-emitter semiconductor laser element 120, a plurality of elliptical shapes corresponding to a plurality of emitters are shown. In FIG. 5, two laser beams are emitted from each light emitting point, and two FFPs are shown.

As shown in FIG. 4, in the case of a single emitter, a point passing through the optical axis is the center, the major diameter of the FFP is the first diameter, and the minor diameter is the second diameter. That is, in this Specification, the first diameter is the diameter in the direction corresponding to the major diameter of the FFP, and the second diameter is the diameter in the direction corresponding to the minor diameter of the FFP.

Next, in the case of a multi-emitter having two emitters, the center is the center of gravity of two points at the same optical path length, in this case, the midpoint between the two points, for light passing through the optical axes of two FFPs. In the smallest rectangle that will encompass both of the two elliptical shapes, the length of the side corresponding to the major axis direction of the ellipse is the first diameter, and the length of the side corresponding to the minor axis direction of the ellipse is the second diameter. The term "corresponding" here preferably means that the sides of the rectangle and the diameter of the ellipse are in the same direction, but in the case that the sides of the rectangle and the diameter of the ellipse are not in the same direction, then among the plurality of combinations of sides and diameters, this term means the combination of sides and diameter with the smallest relative angle difference.

By the same line of reasoning, the center, the first diameter, and the second diameter can be defined for a multi-emitter having three or more emitters. That is, the center is the center of gravity determined on the basis of a point passing through the optical axis in all the emitters at the same optical path length, and the first diameter and the second diameter are the lengths of the sides corresponding to the major axis direction or the minor axis direction found on the basis of the smallest rectangle that will encompass all the FFPs.

The center defined in this way is P, the first diameter is X, and the second diameter is Y. These are expressed as P(1), X(1), Y(1) for the first semiconductor laser element 121 (the first one of the semiconductor laser elements 120), as P(2), X(2), Y(2) for one of the second semiconductor laser elements 122 (the second one of the semiconductor laser elements 120), and as P(3), X(3) and Y(3) for the other one of the second semiconductor laser elements 122 (the third one of the semiconductor laser elements 120). In the case that the light emitting device 100 has four or more semiconductor laser elements 120, they are distinguished from each other by adding numbers in parentheses in this same way.

The light emitted from the three semiconductor laser elements 120 is preferably combined so that all of the centers at the exit points from the polarization control members 20 fit within a rectangle in which the sum of the first diameters of the light beams of the three semiconductor laser elements 120 is the length of one side, and the sum of the second diameters of the three semiconductor laser elements 120 is the length of the other side. That is, P(1), P(2), and P(3) preferably fit within a rectangular region in which X(1)+X(2)+X(3) is one side and Y(1)+Y(2)+Y(3) is the other side.

Further, it is preferable in the case that all of the main portions of the light emitted from the three semiconductor laser elements 120 are combined so as to fit within a rectangle in which the length of one side is the sum of the first diameters of the three semiconductor laser elements 120 and the length of the other side is the sum of the second diameters of the three semiconductor laser elements 120, at the point where the light exits the polarization control members 20.

The various members are preferably mounted on the basis of a design in which all of the centers of the light emitted from the three semiconductor laser elements 120 are combined by the polarization control members 20 so as to overlap. Combining the light in this way allows the main portions of the light emitted from the three semiconductor laser elements 120 to fit within a smaller area. In the case that the light emitting device 100 has four or more semiconductor laser elements 120, a similar approach can be taken that is based on the sum of the diameters of the semiconductor laser elements 120 or on the centers.

The waveplate 201 of the first polarization control member 21 changes the polarization direction of the exit light from the first semiconductor laser element 121 disposed in the first light emitting device 101. The waveplates 201 of the second polarization control member 22 change the polarization direction of the exit light from the second semiconductor laser element 122 disposed in the second light emitting device 102, A $\lambda/2$ waveplate giving a phase difference of $\lambda/2$ can be used as the waveplate 201, for example. The polarization direction is rotated by 90 degrees by the $\lambda/2$ wavelength plate.

In the example shown in FIG. 1, one first semiconductor laser element 121 and two second semiconductor laser elements 122 are disposed in the light emitting device 100. Therefore, the first polarization control member 21 has one waveplate 201 corresponding to one first semiconductor laser element 121, and the second polarization control member 22 has two waveplates 201 corresponding to the two second semiconductor laser elements 122.

Each waveplate 201 is disposed such that the exit light from the light emitting device 100 is incident on the waveplate 201 before being incident on the dichroic mirror 200. In the example shown in FIG. 1, a polarization control member 20 to which a waveplate 201 has been joined by bonding is formed on the face (incident face) of the dichroic mirror 200 on which the exit light from the light emitting device 100 is incident. Thus using a polarization control member 20 in which dichroic mirrors 200 and waveplates 201 are integrally joined allows the light synthesizing device to be designed more compactly.

The polarization control member 20 need not have the dichroic mirrors 200 and the waveplate 201 integrally joined. For example, the dichroic mirrors 200 and the waveplate 201 may be provided separately. In this case, the waveplate 201 that changes the polarization direction of light corresponds to the polarization control member 20.

The polarization direction of the exit light from the first semiconductor laser element 121 in the first light emitting device 101 is rotated by 90 degrees by the waveplate 201 of the first polarization control member 21, and becomes the same as the polarization direction of the exit light from the second semiconductor laser element 122 in the first light emitting device 101. Also, the polarization direction of the exit light from the second semiconductor laser element 122 in the second light emitting device 102 is rotated by 90 degrees by the waveplates 201 of the second polarization control member 22 and becomes the same as the polarization direction of the exit light from the first semiconductor laser element 121 in the second light emitting device 102. Therefore, in the exit light before being incident on the polarization control member 20, the polarization direction of the exit light from the first semiconductor laser element 121 and the exit light from the second semiconductor laser element 122 that have exited the light emitting device 100 differ by 90 degrees.

The mirror 30 is a light reflecting member that reflects the light incident on the reflecting face. In the projection device 1, the mirror 30 is provided for the exit light from the second light emitting device 102. No mirror is provided for the exit light from the first light emitting device 101. Alternatively, a mirror may be provided for the exit light from the first light emitting device 101, but not for the exit light from the second light emitting device 102. Also, a plurality of mirrors 30 may be provided corresponding to each of the first light emitting device 101 and the second light emitting device 102.

The PBS 40 is an optical filter that transmits p-polarized light and reflects s-polarized light. In the projection device 1, exit light produced by the first and second semiconductor laser elements 121 and 122 of the first light emitting device 101 is aligned in p-polarization by the first polarization control member 21, and is then incident on the PBS 40. The exit light produced by the first and second semiconductor laser elements 121 and 122 of the second light emitting device 102 is aligned in s-polarization by the second polarization control member 22, and is then incident on the PBS 40.

Consequently, exit light from the first light emitting device 101 is transmitted at the PBS 40, and exit light from the second light emitting device 102 is reflected. As a result, the exit light from the first light emitting device 101 and the exit light from the second light emitting device 102 are combined. That is, the PBS 40 causes the exit light from the first light emitting device 101 and the exit light from the second light emitting device 102 to travel in the same direction.

Here, "the same direction" shall mean that among the light beams from any two of the six semiconductor laser elements 120 mounted in the first light emitting device 101 and the second light emitting device 102, the relative angle difference in the direction in which the central light travels is within 10 degrees. The PBS 40 is an example of a synthesis member that combines the exit light from the first light emitting device 101 and the exit light from the second light emitting device 102.

The exit light from the first light emitting device 101 to be combined has the light from the first semiconductor laser element 121 whose polarization direction has been changed by the first polarization control member 21, and the light from the second semiconductor laser elements 122 whose polarization direction has not been changed by the first polarization control member 21. Also, the exit light from the second light emitting device 102 to be combined has the light from the first semiconductor laser element 121 whose polarization direction has not been changed by the second polarization control member 22, and the light from the second semiconductor laser elements 122 whose polarization direction has been changed by the second polarization control member 22.

The light emitted from the six semiconductor laser elements 120 is preferably combined so that all of the centers will fit within a rectangle in which the length of one side is the sum of the first diameters of the six semiconductor laser elements 120 and the length of the other side is the sum of the second diameters of the six semiconductor laser elements 120, at the point of exit from the PBS 40.

That is, P(1), P(2), P(3), P(4), P(5) and P(6) are preferably gathered together within the region of a rectangle in which one side is X(1)+X(2)+X(3)+X(4)+X(5)+X(6) and the other side is Y(1)+Y(2)+Y(3)+Y(4)+Y(5)+Y(6).

Further, all of the main portion light beams emitted from the six semiconductor laser elements 120 are preferably combined so as to fit within a rectangle in which the length of one side is the sum of the first diameters of the light of the six semiconductor laser elements 120 and the length of the other side is the sum of the second diameters of the light of the six semiconductor laser elements 120, at the point of exit from the PBS 40.

In addition, mounting is preferably performed on the basis of a design in which the light beams are combined by the PBS 40 such that the centers of the light from the semiconductor laser elements 120 in the same layout relationship between the first light emitting device 101 and the second light emitting device 102 overlap. The semiconductor laser elements 120 in the same layout relationship are the first semiconductor laser elements 121, the second semiconductor laser elements 122 adjacent to the first semiconductor laser elements 121, and the remaining second semiconductor laser elements 122 adjacent to the second semiconductor laser elements 122. Combining the light in this manner allows the main portion of the light beams emitted from the six semiconductor laser elements 120 to be combined so as to fit in a smaller area.

The light that has exited the first light emitting device 101 and the second light emitting device 102 is combined by the PBS 40 so that light exits the PBS 40 with at least 140% of the optical energy of the exit light at the point of exit from one of the first light emitting device 101 and the second light emitting device. Alternatively, light exits the PBS 40 with at least 70% of the sum of the optical energy of the exit light at the point of exit from the first light emitting device 101 and the optical energy of the exit light at the point of exit from the second light emitting device 102. The optical energy can be measured with a power meter, for example, with the unit of measure being watts, for example.

The disposition of the constituent components up to the combination of light by the PBS 40 in an embodiment will be described. Of the two light emitting units 10, the first light emitting unit 11 is disposed at a position farther from the PBS 40 than the second light emitting unit 12. Also, the distance between the first light emitting unit 11 and the first polarization control member 21 is greater than the distance between the second light emitting unit 12 and the second polarization control member 22. Also, the exit light reflected by the dichroic mirror 200 of the first polarization control member 21 and the exit light reflected by the dichroic mirror 200 of the second polarization control member 22 travel in the same direction.

The exit light reflected by the dichroic mirror 200 of the second polarization control member 22 is reflected by the mirror 30, and proceeds in a direction different by 90 degrees from the direction in which the exit light reflected by the dichroic mirror 200 of the first polarization control member 21 proceeds. In the case that this light is incident on the PBS 40, the travel direction of the exit light from the first light emitting device 101 and the travel direction of the exit light from the second light emitting device 102 differ by 90 degrees.

Thus, in order to utilize the properties of transmission and reflection of the PBS 40 by changing the direction of incidence on the PBS 40 by 90 degrees, in the first light emitting device 101, the polarization direction of the first semiconductor laser element 121 is changed to be aligned with the polarization direction of the second light emitting device 102, and in the second light emitting device 102, the polarization direction of the second semiconductor laser element 122 is changed to be aligned with the polarization direction of the first semiconductor laser element 121.

The diffusion lens 51 diffuses the light thus combined (hereinafter referred to as combined light). The diffusion lens 51 has the shape of a concave lens with a cylindrical surface. Using a cylindrical surface keeps light from being diffused by the diffusion lens 51 in the direction of no curvature.

In the projection device 1, the diffusion lens 51 is disposed such that, of the light from a semiconductor laser element 120 having an elliptical FFP, the major axis direction of the ellipse does not have the curvature of a cylindrical surface. In the irradiation area of the combined light upon being incident on the diffusion lens 51, the width in the direction corresponding to the light passing through the major axis of the ellipse is greater than the width in the direction corresponding to the light passing through the minor axis of the ellipse. Therefore, the difference in width is reduced in the case that the light passes through the diffusion lens 51.

The light that has passed through the diffusion lens 51 then passes through the collimating lens 52, which collimates the light in the diffusion direction, that is, the light in the direction corresponding to the minor diameter of the ellipse. The direction corresponding to the major axis of the ellipse has already been collimated. The light collimated by the collimating lens 52 is split into a plurality of small light fluxes by passing through the lens array 53. The light split into a plurality of small light fluxes by the lens array 53 is passed through the superimposing lens 54 and thereby superimposed such that more uniform light is incident on the DMD 60. The DMD 60 modulates the incident light by time division to generate image light to be projected onto a screen. The image light generated by the DMD 60 goes through the two prisms 70 and is incident on the projection unit 80. The image light incident on the projection unit 80 is projected onto the screen.

As described above, with to the projection device 1, light exiting the plurality of light emitting devices 100 can be effectively combined by using a plurality of light emitting devices 100 that emit light having different polarization directions.

Figure 6:
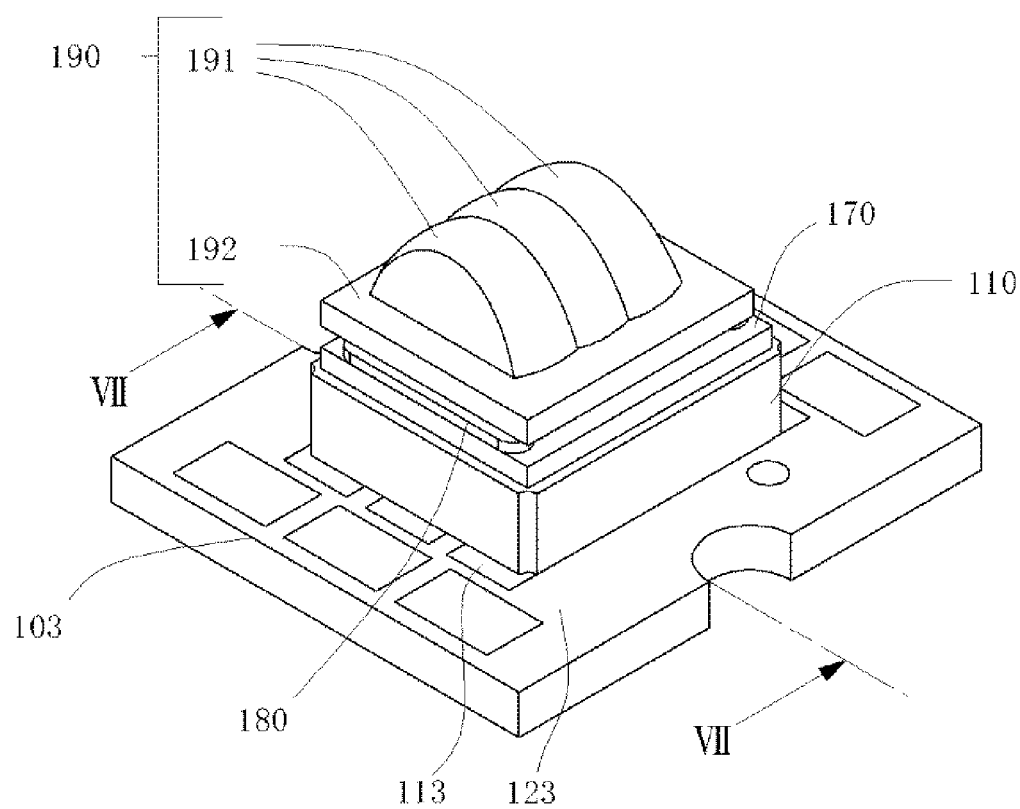
FIG. 6 is a perspective view of a light emitting device according to an embodiment.
Figure 7:
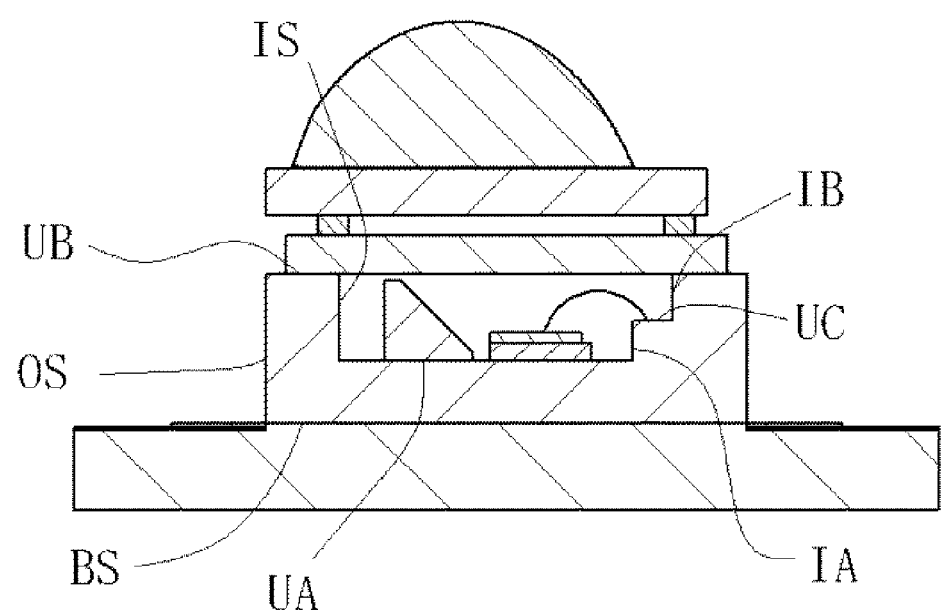
FIG. 7 is a cross-sectional view of the light emitting device along the VII-VII line in FIG. 6.
Figure 8:
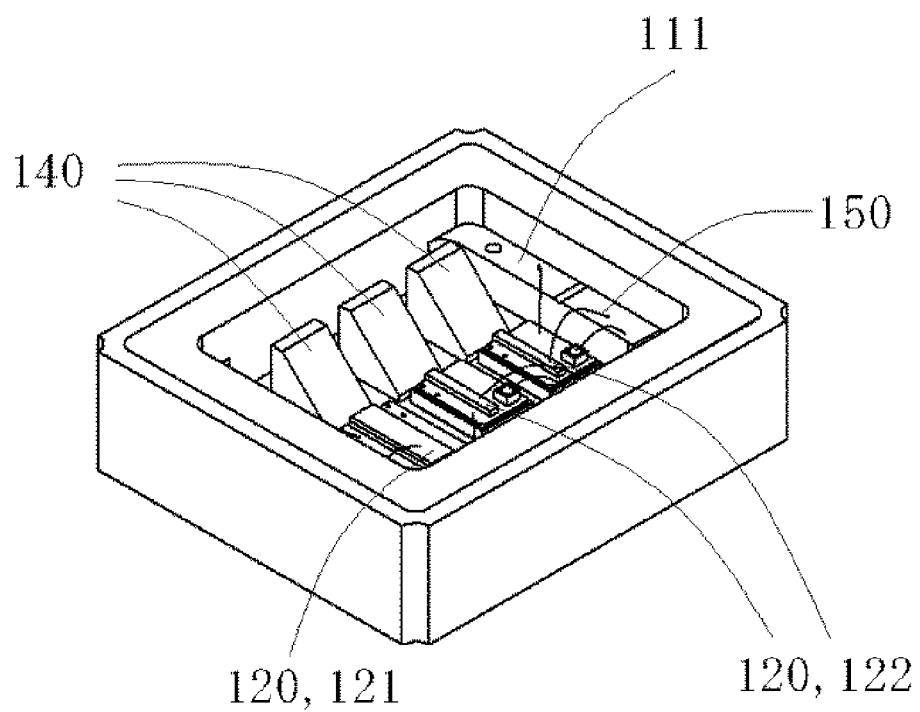
FIG. 8 is a perspective view showing an internal structure of the light emitting device.
Figure 9:
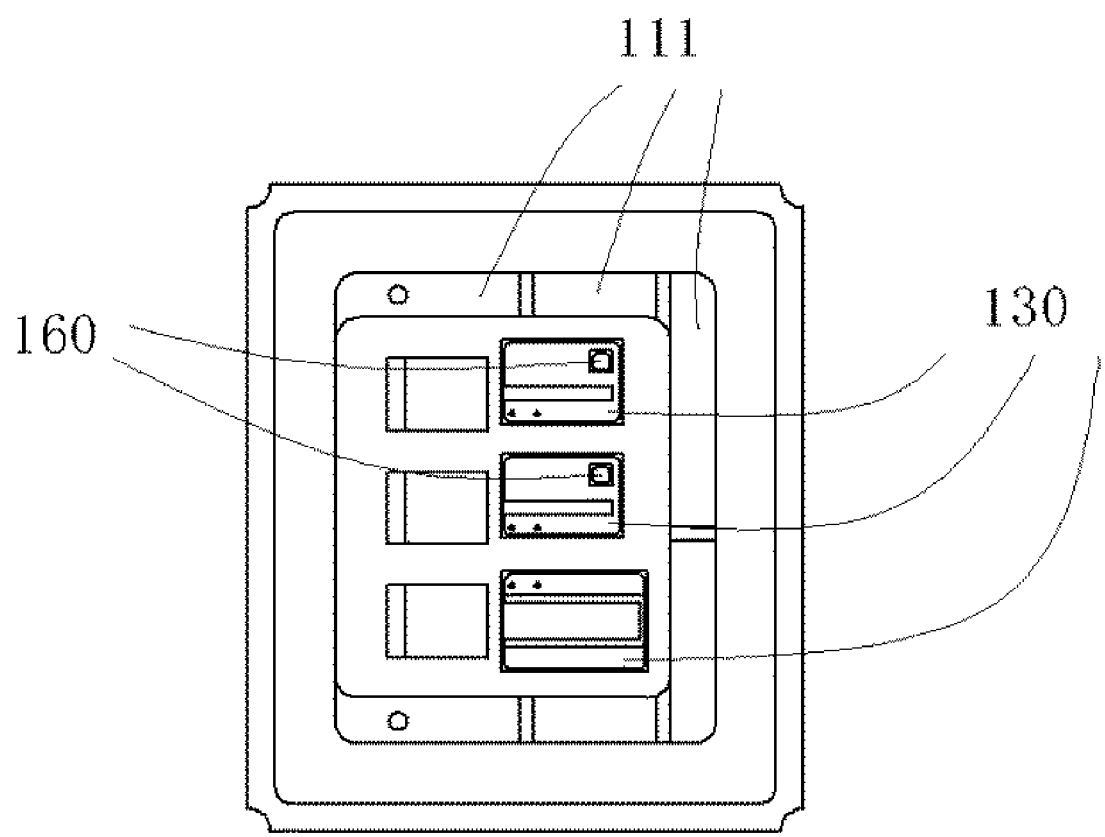
FIG. 9 is a top view showing an internal structure of the light emitting device.

Next, an embodiment of the light emitting device 100 applied to the projection device 1 according to an embodiment will be described with reference to FIGS. 6 to 9. The form of the light emitting device 100 applied to the projection device 1 is not limited to this. FIG. 6 is a perspective view of the light emitting device 100 joined to the mounting substrate 103. FIG. 7 is a cross section along the VII-VII line in FIG. 6. FIG. 8 is a perspective view of the internal structure of the light emitting device 100. FIG. 9 is a top view of the internal structure of the light emitting device 100.

The light emitting device 100 has a base 110, three semiconductor laser elements 120, a submount 130, a light reflecting member 140, a protective element 160, a wire 150, a lid member 170, an adhesive component 180, and a lens member 190 as constituent components. One of the three semiconductor laser elements 120 is a first semiconductor laser element 121, and two are second semiconductor laser elements 122.

The base 110 has a bottom surface BS and an outer surface OS that intersects the bottom surface BS. It also has a first upper surface UA, an inner surface IS that intersects the first upper surface UA, and a second upper surface UB that intersects the inner surface IS on the opposite side from the first upper surface UA. The outer surface OS intersects the second upper surface UB on the opposite side from the inner surface IS. A step is formed on part of inner surface IS. Therefore, in the portion where the step is formed, the inner surface IS has a first inner surface IA that intersects the first upper surface UA, and a second inner surface IB that intersects the second upper surface UB. A third upper surface UC is formed that intersects the first inner surface IA and the second inner surface IB. The base 110 also forms a concave structure, and the recess in the concave structure extends from the second upper surface UB to the first upper surface UA. Therefore, in top view, the first upper surface UA is surrounded by the second upper surface UB.

The base 110 can be formed using a ceramic as the main material, but a ceramic is not the only option, and the base may be formed from a metal instead. For example, aluminum nitride, silicon nitride, aluminum oxide, or silicon carbide can be used as a ceramic, copper, aluminum, or iron can be used as a metal, and copper-molybdenum, a copper-diamond composite material, or copper-tungsten can be used as a composite for the main material of the base 110.

A plurality of metal films 111 are provided on the third upper surface UC of the base 110. A metal film 111 is also provided on the bottom surface. The metal film 111 on the third upper surface UC and the metal film 111 on the bottom surface can be electrically connected by the metal passing through the interior of the base 110.

The base 110 may be such that frame component forming the frame and the bottom component forming the first upper surface are formed from different main materials, and the base 110 may be formed by joining the frame component and the bottom component. For example, the base 110 may be formed by joining a plate-like bottom component whose main material is a metal and whose thickness extends from the first upper surface UA to the bottom surface BS, to a frame component having a frame whose main material a ceramic and whose height extends from the second upper surface UB to the bottom surface BS.

The first semiconductor laser element 121 has a lower surface, an upper surface, and side surfaces, and emits laser light whose polarization is TM mode from one side surface (the light exit end face). The two second semiconductor laser elements 122 have a lower surface, an upper surface, and side surfaces, and emits laser light whose polarization is TE mode from one side surface (the light exit end face).

The first semiconductor laser element 121 emits red light. One of the two second semiconductor laser elements 122 emits blue light and the other emits green light. A semiconductor laser element 120 that emits light of some other color may be used, and a plurality of semiconductor laser elements 120 of the same color may be disposed. Also, the number of semiconductor laser elements 120 provided is not be limited to three, so long as there is at least one.

Here, "red light" refers to light whose emission peak wavelength is within the range of 605 nm to 750 nm. The red light employed in the light emitting device 100 is more preferably within the range of 610 nm to 700 nm. Examples of the semiconductor laser element 120 that emits red light include those containing an InAlGaP-based, GaInP-based, GaAs-based or AlGaAs-based semiconductor. The output of these semiconductor laser elements 120 is more likely to be reduced by heat than a semiconductor laser element 120 containing a nitride semiconductor. In light of this, it is good to provide two or more waveguide regions. Increasing the waveguide regions allows heat to be dissipated and reduces the drop in output of the semiconductor laser elements 120.

"Blue light" refers to light whose emission peak wavelength is within the range of 420 nm to 494 nm. The blue light employed in the light emitting device 100 is more preferably within the range of 440 nm to 475 nm, Examples of the semiconductor laser element 120 that emits blue light include one containing a nitride semiconductor. For instance, GaN, InGaN, and AlGaN can be used as a nitride semiconductor.

"Green light" refers to light whose emission peak wavelength is within the range of 495 nm to 570 nm. The green light employed in the light emitting device 100 is more preferably within the range of 510 nm to 550 nm. Examples of the semiconductor laser element 120 that emits green light include one that contains a nitride semiconductor. For example, (GaN, InGaN, and AlGaN can be used as a nitride semiconductor.

The first semiconductor laser element 121 is a multi-emitter semiconductor laser element 120 having two emitters as shown in FIG. 5. The second semiconductor laser element 122 is a single-emitter semiconductor laser elements 120 as shown in FIG. 4.

The submount 130 has a lower surface, an upper surface, and side surfaces, and is configured in a cuboid shape. The shape is not limited to being cuboid. The submount 130 can be formed using silicon nitride, aluminum nitride, or silicon carbide, for example. These are not the only options, however, and other materials can be used instead. In addition, a metal film is provided to the upper surface of the submount 130.

The light reflecting member 140 has a lower surface, side surfaces that intersect the lower surface, and an upper surface that intersects a part of the side surface on the opposite side from the lower surface. In addition, it has a light reflecting face that intersects another part of the side surface on the opposite side from the lower surface and intersects in a region of the upper surface that does not intersect the side surface. The light reflecting face is flat and inclined from the upper surface to the lower surface. The light reflecting face is designed to form an angle of 45 degrees with the lower surface. The angle need not be 45 degrees, and the light reflecting face may be a curved face instead of a flat face.

The outer shape of the light reflecting member 140 can be formed using the main material, and a light reflecting film is formed on the surface of this outer shape on which the light reflecting face is to be provided. The main material is preferably one that is resistant to heat, and examples include quartz, BK7 (borosilicate glass) and other types of glass, aluminum and other such metals, and silicon. The light reflecting film is preferably made of a material having high optical reflectance, and silver, aluminum, or another such metal, a dielectric multilayer film such as $Ta_2O_5/SiO_2$, $TiO_2/SiO_2$, or $Nb_2O_5/SiO_2$, or the like can be employed.

In the case that the outer shape is formed by using a material having high light reflectance such as metal as a main material, the formation of the light reflecting film may be omitted. The light reflecting face can have an optical reflectance of 99% or more with respect to the peak wavelength of the laser light to be reflected. The optical reflectance can be 100% or less, or less than 100%. The protective element 160 is a Zener diode, for example. The wire 150 is a metal wire.

The lid member 170 has a lower surface, an upper surface, and side surfaces, is formed in a cuboid shape, and is entirely light transmissive, although it may have a non-light transmissive region. Also, the shape is not limited to being cuboid. The lid member 170 can be formed using sapphire as the main material. In addition, a metal film is provided to a partial region. Sapphire is a material having a relatively high refractive index and relatively high strength. In addition to sapphire, glass or the like can also be used as the main material, for example.

The adhesive component 180 is formed by solidifying an adhesive. The adhesive agent used to form the adhesive component 180 can be a UV-curing resin. Since a UV-curing resin can be cured in a relatively short time without heating, the lens member 190 can be easily fixed in the desired position.

The lens member 190 has a lower surface, side surfaces, and an upper surface that intersects the side surfaces. The upper surface of the lens member 190 has a lens component 191 having a lens shape, and a non-lens component 192 arranged in regions other than where the lens component 191 is arranged. Alternatively, the lens member 190 is shaped such that the lens component 191 is disposed on the upper surface of a cuboid non-lens component 192 as shown in FIGS. 5 and 6. A plurality of the lens components 191 are formed on the upper surface of the lens member 190. The lens components 191 are formed in an integrally connected shape. BK7, B270, or another type of glass can be used for the lens member 190, for example.

The mounting substrate 103 has a lower surface, side surfaces, and an upper surface. Its main material is made of a metal, and the insulating film 123 and the metal film 113 are provided on it. On the upper surface of the mounting substrate 103 there are regions where the insulating film 123 and the metal film 113 are exposed. Aluminum or copper can be used as the metal, for example. Using such a metal affords a good heat dissipation effect with respect to heat generated from the first semiconductor laser element 121 and the second semiconductor laser element 122. That is, the mounting substrate 103 can also serve as a heat dissipation member.

Next, the light emitting device 100 manufactured using these components will be described.

Three semiconductor laser elements 120 are disposed on the first upper surface UA of the base 110 via the submount 130. The submount 130 is separately provided for each of the semiconductor laser elements 120. A plurality of semiconductor laser elements 120 may be disposed on the upper surface of a single submount 130. Also, a semiconductor laser element 120 may be disposed directly on the first upper surface UA without having the submount 130 interposed between them.

The lower surface of the submount 130 is joined to the first upper surface UA of the base 110, and its upper surface is joined to the semiconductor laser element 120. The semiconductor laser element 120 is disposed such that the light exit end face of the semiconductor laser element 120 is aligned with or protrudes from the side surface of the submount 130. This keeps the light emitted from the semiconductor laser element 120 from shining on the upper surface of the submount 130. In addition, a protective element 160 is disposed on the upper surface of the submount 130.

In the case that a submount 130 is used which has a thermal conductivity higher than that of the first upper surface UA of the base 110, a better effect as a heat spreader can be obtained. For example, in the case that aluminum nitride is used for the first upper surface UA of the base 110, aluminum nitride or silicon carbide can be used for the submount 130. The thermal conductivity of the aluminum nitride used for the submount 130 in this case is higher than that of the aluminum nitride used for the base 110.

The submount 130 is designed such that the height from the first upper surface UA is the same for all three of the semiconductor laser elements 120. Further, the light exit end faces of the semiconductor laser elements 120 are designed to be disposed all in the same virtual plane. Although the design is the same, error may occur due to member tolerances, mounting tolerances, etc., at the mounting stage. In the case that the height, length, position, relative positional relation, and so forth of the light emitting device 100 are the same, this error is considered to fall within a permissible range.

The light reflecting member 140 is disposed on the first upper surface UA of the base 110. Light reflecting members 140 are individually provided corresponding to the respective semiconductor laser elements 120. The three semiconductor laser elements 120 are designed so that the distance between the light exit end face of each semiconductor laser element 120 and the corresponding light reflecting member 140 will be the same. Also, in all three of the semiconductor laser elements 120, the central light reflected by the light reflecting member 140 travels in a direction perpendicular to the first upper surface UA. One light reflection member 140 may be disposed corresponding to a plurality of semiconductor laser elements 120.

The main portion of the light emitted from a semiconductor laser element 120 shines on the light reflecting face of the corresponding light reflection member 140, By interposing the light reflection member 140, the optical path length of the light emitted from the semiconductor laser element 120 can be made longer than in the case that no light reflecting member 140 is interposed. The longer is the optical path length, the less is the influence of mounting deviation between the light reflecting member 140 and the semiconductor laser element 120.

A plurality of wires 150 are joined at one end to the metal film 111 provided on the upper surface (third upper surface UC) of a stepped portion. The other ends of the wires 150 are respectively joined to the semiconductor laser element 120, to the protective element 160, or to a metal film provided on the upper surface of the submount 130. Consequently, the semiconductor laser element 120 and the protective element 160 are electrically connected via the metal film 111 provided on the lower surface of the base 110.

The stepped portion is not provided on the inner surface IS of the base 110, which is farther ahead in the travel direction of the light emitted from the semiconductor laser element 120 and passing through the optical axis. In the case that the stepped portion is provided on the inner surface IS and the wires 150 are pulled, the wires 150 will stretch over the light reflecting member 140 and will be in the way of the reflected light on the optical path, so no stepped portion for electrical connection is provided. Not providing the stepped portion all the way around the inner surface allows the size of the base 110 to be smaller.

The lower surface of the lid member 170 is joined to the second upper surface UB of the base 110. The lid member 170 and the base 110 are provided with a metal film in the area to be joined, and are fixed via Au—Sn or the like. A closed space is formed by joining the base 110 and the lid member 170. This closed space is a hermetically sealed space. Thus hermetically sealing minimizes the collection of organic substances and the like at the light exit end face of the semiconductor laser element 120.

The light reflected by the light reflecting face of the light reflecting member 140 is incident on the lid member 170. The lid member 170 is designed such that the region from where at least the main portion of the reflected light incident up until it exits is light transmissive. Here, "light transmissive" means that the transmittance of light is at least 80%.

The adhesive component 180 is formed on the upper surface of the lid member 170 in the region where the lid member 170 and the lens member 190 are bonded. The adhesive component 180 is formed by curing an adhesive agent in a state in which it has been applied to the upper surface of the lid member 170 and the lower surface of the lens member 190. At this point, the adhesive component 180 is formed so that the lid member 170 and the lens member 190 are not in contact. Giving enough thickness to the adhesive component 180 in this manner allows the lens member 190 to be joined to the lid member 170 after the position and height have been adjusted. Also, the adhesive component 180 is formed so as not to be provided on the optical path of the light emitted from the semiconductor laser element 120. Therefore, it is preferably formed on the outer edge of the lens member 190.

The lens member 190 is disposed on the lid member 170, joined to the lid member 170 via the adhesive component 180. The number of lens components 191 in the lens member 190 is the same as the number of semiconductor laser elements 120 disposed on the base 110. Therefore, in the case that there are three semiconductor laser elements 120, then the lens member 190 is provided with three lens components 191 in an integrally connected shape.

Also, one semiconductor laser element 120 corresponds to one lens component 191. The layout and shape of the lens components 191 are designed so that the light reflected by the light reflecting member 140, out of the main portion of light emitted from the corresponding semiconductor laser element 120, will pass through the lens component 191 and be collimated.

In the light emitting device 100, a pair of metal films 111 provided to the lower surface is joined to the metal film 113 of the mounting substrate 103. The joining of the light emitting device 100 and the mounting substrate 103 can be accomplished by soldering. Joining the metal films 111 on the lower surface of the light emitting device 100 and the metal film 113 of the mounting substrate 103 results in self-alignment in the case that the light emitting device 100 is fixed to the mounting substrate 103.

With this light emitting device 100, collimated light is emitted in red, blue, and green to the outside of the light emitting device 100. Also, this collimated light travels in a direction perpendicular to the upper surface of the mounting substrate 103 or the first upper surface UA of the base 110. Also, since the central light of the three semiconductor laser elements 120 travels in the same direction from the light exit end faces, at the point of being emitted from the light exit end faces and at the point of passing through the lens member 190, the polarization direction of the light emitted from the first semiconductor laser element 121 differs by 90 degrees from that of the light emitted from the second semiconductor laser element 122. For example, this results in a relation such that one is p-polarization, the other is s-polarization.

The light emitting device 100 is joined to the mounting substrate 103 and is incorporated as the light emitting unit 10 into the projection device 1, and at this point the first semiconductor laser element 121 is disposed such that its optical path length up to the PBS 40 is the shortest of the three semiconductor laser elements 120. To look at this another way, the multi-emitter first semiconductor laser element 121 is disposed such that its optical path length to the PBS 40 is shorter than that of the single-emitter second semiconductor laser element 122.

In the case of a multi-emitter, a laser beam is emitted from each emitter. The central light beams from the emitters pass through different points of a single lens component 191. The central light beams that have passed through the lens component 191 then move closer together and cross at a certain point. After thus crossing, they move away from each other. That is, the light emitted from the multi-emitter first semiconductor laser element 121 is such that the central light beams move farther apart as the optical path length becomes longer after crossing. Therefore, this spreading out can be minimized by disposing the components so that the optical path length of the first semiconductor laser element 121 up to the PBS 40 is shorter than that of the second semiconductor laser element 122.

An embodiment to which the present invention is applied was disclosed above, but the present invention can be applied not only to this embodiment. For example, some or all of the optical configuration shown in the projection device 1 according to the embodiment can be used to construct a light synthesizing device that combines light emitted from each of a plurality of light emitting units. The light synthesizing device is made up of a plurality of light emitting units and a synthesis unit that combines the exit light from the plurality of light emitting devices.

The light emitting unit has at least a light emitting device, and the synthesis unit has at least a polarization control member and a synthesis member. In addition, the synthesis unit can be made up of some or all of the dichroic mirror 200, the waveplate 201, the mirror 30, the PBS 40, the lenses 51-54, the DMD 60, the prisms 70, and the projection unit 80 shown in the projection device 1 according to the embodiment. Therefore, the light synthesizing device is not limited to a light synthesizing device in the form of the projection device 1, and can be applied to a variety of devices that control light.

The projection device having the above technical features is not limited to the structure of the projection device 1 disclosed in the embodiment. For example, the present invention can also be applied to a projection device having constituent components not disclosed in the embodiment, and any differences from the projection device 1 in the embodiment do not mean that the present invention is inapplicable.

In other words, this means that the present invention can be applied without necessarily providing all the constituent components of the projection device 1 disclosed in the embodiment. For example, in the case that some of the constituent components of the projection device 1 disclosed in the embodiment were not mentioned in the Claims, it is claimed that for some of those constituent components there will be some freedom of design by a person skilled in the art in terms of substitution, omission, deformation of shape, changes in material and so forth, and that the inventions described in the Claims are applied with that in mind.

The light synthesizing device described in each embodiment can be used for a projector, an in-vehicle headlight, illumination, a display backlight, and the like.

What is claimed is:
1. A light synthesizing device comprising:
a first light emitting device and a second light emitting device each having at least one first semiconductor laser element and at least one second semiconductor laser element, the first light emitting device being configured such that a polarization direction of exit light from the at least one first semiconductor laser element that has exited the first light emitting device is different from a polarization direction of exit light from the at least one second semiconductor laser element that has exited the first light emitting device;
a first polarization control member configured to change the polarization direction of the exit light from the first semiconductor laser element of the first light emitting device;

a second polarization control member configured to change the polarization direction of the exit light from the second semiconductor laser element of the second light emitting device; and a synthesis member configured to combine light exited from the first light emitting device including the exit light from the at least one first semiconductor laser element of the first light emitting device whose polarization direction has been changed by the first polarization control member, and light exited from the second light emitting device including the exit light from the at least one second semiconductor laser element of the second light emitting device whose polarization direction has been changed by the second polarization control member.

2. The light synthesizing device according to claim 1, wherein
the exit light from the at least one first semiconductor laser element of the first light emitting device and the exit light from the at least one first semiconductor laser element of the second light emitting device respectively pass along optical axes in the same travel direction and in the same polarization direction, and
the exit light from the at least one second semiconductor laser element of the first light emitting device and the exit light from the at least one second semiconductor laser element of the second light emitting device respectively pass along optical axes in the same travel direction and in the same polarization direction.

3. The light synthesizing device according to claim 1, wherein
the first polarization control member has a waveplate configured to rotate the polarization direction of the exit light from the at least one first semiconductor laser element of the first light emitting device by 90 degrees, and
the second polarization control member has a waveplate configured to rotate the polarization direction of the exit light from the at least one second semiconductor laser element of the second light emitting device by 90 degrees.

4. The light synthesizing device according to claim 3, wherein
the first polarization control member has a plurality of dichroic mirrors configured to combine the exit light from the at least one first semiconductor laser element and the exit light from the at least one second semiconductor laser element of the first light emitting device, and
the second polarization control member has a plurality of dichroic mirrors configured to combine the exit light from the at least one first semiconductor laser element and the exit light from the at least one second semiconductor laser element of the second light emitting device.

5. The light synthesizing device according to claim 4, wherein
the waveplate of the first polarization control member is bonded to an incident surface of at least one of the dichroic mirrors on which the exit light passing through an optical axis emitted from the at least one first semiconductor laser element is incident, and
the waveplate of the second polarization control member is bonded to an incident surface of at least one of the dichroic mirrors on which the exit light passing through an optical axis emitted from the at least one second semiconductor laser element is incident.

6. The light synthesizing device according to claim 5, wherein
the first polarization control member is configured to change the polarization direction of the exit light from the at least one first semiconductor laser element of the first light emitting device to the same polarization direction of the exit light from the at least one second semiconductor laser element of the first light emitting device, and
the second polarization control member is configured to change the polarization direction of the exit light from the at least one second semiconductor laser element of the second light emitting device to the same polarization direction of the exit light from the at least one first semiconductor laser element of the second light emitting device.

7. The light synthesizing device according to claim 6, wherein
the first polarization control member is configured to change the polarization direction of the exit light from the at least one first semiconductor laser element of the first light emitting device to p-polarized light that is the polarization direction of the exit light from the at least one second semiconductor laser element of the first light emitting device, and
the second polarization control member is configured to change the polarization direction of the exit light from the at least one second semiconductor laser element of the second light emitting device to s-polarized light that is the polarization direction of the exit light from the at least one first semiconductor laser element of the second light emitting device.

8. The light synthesizing device according to claim 7, wherein
the synthesis member is a polarizing beam splitter configured to transmit the p-polarized light and reflect the s-polarized light so that the polarizing beam splitter transmits the light exited from the first light emitting device and reflect the light exited from the second light emitting device, and the light exited from the first light emitting device and the light exited from the second light emitting device are combined.

9. The light synthesizing device according to claim 6, wherein
the at least one first semiconductor laser element is configured to emit light whose polarization is TM mode, and
the at least one second semiconductor laser element is configured to emit light whose polarization is TE mode.

10. The light synthesizing device according to claim 1, wherein
an optical energy of emitted light combined by the synthesis member is at least 70% of the sum of an optical energy of exit light exited from the first light emitting device and an optical energy of exit light exited from the second light emitting device.

11. The light synthesizing device according to claim 1, wherein
the second light emitting device is configured such that a polarization direction of exit light from the at least one first semiconductor laser element that has exited the second light emitting device is different from a polarization direction of exit light from the at least one second semiconductor laser element that has exited the second light emitting device.

12. The light synthesizing device according to claim 1, wherein the exit light from the at least one first semiconductor laser element that has exited the first light emitting device whose polarization direction is changed by the first polarization control member and the exit light from the at least one second semiconductor laser element that has exited the second light emitting device before being incident on the second polarization control member respectively have the same polarization direction.

13. The light synthesizing device according to claim 1, wherein
the exit light from the at least one second semiconductor laser element that has exited the second light emitting device whose polarization direction is changed by the second polarization control member and the exit light from the at least one first semiconductor laser element that has exited the first light emitting device before being incident on the first polarization control member have the same polarization direction.

14. The light synthesizing device according to claim 1, wherein
in each of the first light emitting device and the second light emitting device, a wavelength of the exit light from the at least one first semiconductor laser element is longer than a wavelength of exit light from the at least one second semiconductor laser element.

15. A light synthesizing device comprising:
a first light emitting device and a second light emitting device each having at least one first semiconductor laser element and at least one second semiconductor laser element, each of the first light emitting device and the second light emitting device being configured such that a polarization direction of exit light from the at least one first semiconductor laser element that has exited a corresponding one of the first light emitting device and the second light emitting device is different from a polarization direction of exit light from the at least one second semiconductor laser element that has exited the corresponding one of the first light emitting device and the second light emitting device;
a first polarization control member configured to change the polarization direction of the exit light from the first semiconductor laser element of the first light emitting device;
a second polarization control member configured to change the polarization direction of the exit light from the second semiconductor laser element of the second light emitting device; and
a synthesis member configured to combine light exited from the first light emitting device including the exit light from the at least one first semiconductor laser element of the first light emitting device whose polarization direction has been changed by the first polarization control member, and light exited from the second light emitting device including the exit light from the at least one second semiconductor laser element of the second light emitting device whose polarization direction has been changed by the second polarization control member, wherein
the first polarization control member is configured to change the polarization direction of the exit light from the at least one first semiconductor laser element of the first light emitting device to the same polarization direction of the exit light from the at least one second semiconductor laser element of the first light emitting device, and
the second polarization control member is configured to change the polarization direction of the exit light emitted from the at least one second semiconductor laser element of the second light emitting device to the same polarization direction of the exit light from the at least one first semiconductor laser element of the second light emitting device.

16. The light synthesizing device according to claim 15, wherein
the first polarization control member is configured to change the polarization direction of the exit light from the at least one first semiconductor laser element of the first light emitting device to p-polarized light that is the polarization direction of the exit light from the at least one second semiconductor laser element of the first light emitting device, and
the second polarization control member configured to change the polarization direction of the exit light from the at least one second semiconductor laser element of the second light emitting device to s-polarized light that is the polarization direction of the exit light from the at least one first semiconductor laser element of the second light emitting device.

17. The light synthesizing device according to claim 16, wherein
the synthesis member is a polarizing beam splitter configured to transmit the p-polarized light and reflect the s-polarized light so that the polarizing beam splitter transmits the light exited from the first light emitting device and reflect the light exited from the second light emitting device, and the light exited from the first light emitting device and the light exited from the second light emitting device are combined.

18. The light synthesizing device according to claim 16, wherein
the at least one first semiconductor laser element is configured to emit light whose polarization is TM mode, and
the at least one second semiconductor laser element is configured to emit light whose polarization is TE mode.

19. A light synthesizing device comprising:
a first light emitting device and a second light emitting device each having at least one first semiconductor laser element and at least one second semiconductor laser element, each of the first light emitting device and the second light emitting device being configured such that a polarization direction of exit light from the at least one first semiconductor laser element that has exited a corresponding one of the first light emitting device and the second light emitting device is different from a polarization direction of exit light from the at least one second semiconductor laser element that has exited the corresponding one of the first light emitting device and the second light emitting device;
a first polarization control member configured to change the polarization direction of the exit light from the first semiconductor laser element of the first light emitting device;
a second polarization control member configured to change the polarization direction of the exit light from the second semiconductor laser element of the second light emitting device:
a synthesis member configured to combine light exited from the first light emitting device including the exit light from the at least one first semiconductor laser element of the first light emitting device whose polarization direction has been changed by the first polarization control member, and light exited from the second light emitting device including the exit light from the at least one second semiconductor laser element of the second light emitting device whose polarization direction has been changed by the second polarization control member; and a projection unit configured to project an image on a screen using exit light combined by the synthesis member.

\* \* \* \* \*